United States Patent [19]

Hawkswell

[11] Patent Number: 4,898,507

[45] Date of Patent: Feb. 6, 1990

[54] APPARATUS FOR HANDLING ELECTRICAL OR ELECTRONIC COMPONENTS

[75] Inventor: Victor T. Hawkswell, Witham, England

[73] Assignee: Dynapert, Inc., Beverly, Mass.

[21] Appl. No.: 150,101

[22] Filed: Jan. 29, 1988

[30] Foreign Application Priority Data

Feb. 5, 1987 [GB] United Kingdom ............... 8702617

[51] Int. Cl.$^4$ ............................................. B65H 5/08
[52] U.S. Cl. ................................. 414/225; 901/40; 294/64.1
[58] Field of Search ................... 414/744 B, 752, 222, 414/223, 225, 744 A, 744 C, 751, 744 R, 744.1, 744.3; 901/40, 39, 44, 37; 294/64.1

[56] References Cited

U.S. PATENT DOCUMENTS

| | | | |
|---|---|---|---|
| 3,841,687 | 10/1974 | Banyas et al. | 414/744 B X |
| 4,189,137 | 2/1980 | Denney et al. | 414/752 X |
| 4,501,527 | 2/1985 | Jacoby et al. | 414/744 B X |
| 4,599,037 | 7/1986 | Ross, Jr. et al. | 901/37 X |
| 4,634,489 | 1/1987 | Dupommier | 414/752 X |
| 4,703,965 | 11/1987 | Lee et al. | 294/64.1 |

FOREIGN PATENT DOCUMENTS

| | | | |
|---|---|---|---|
| 2085185 | 1/1970 | France | 901/44 |
| 2040681 | 1/1971 | France | 901/40 |
| 0131847 | 6/1986 | Japan | 414/752 |
| 1055567 | 11/1983 | U.S.S.R. | 901/40 |
| 2076709 | 12/1981 | United Kingdom . | |
| 2096498 | 10/1982 | United Kingdom . | |

*Primary Examiner*—Frank E. Werner
*Assistant Examiner*—Donald W. Underwood
*Attorney, Agent, or Firm*—Spencer Smith

[57] ABSTRACT

Apparatus for handling electronic components comprises a pick-up head 16 including a housing 74 and a tool comprising a elongated support member 80 (providing pick-up mechanism 84,98) mounted in the housing 74 for rotation about an axis D of the head 16 and for axial movement. A sleeve 122 and member 124 are rotatable with the tool but axially movable relative to the member 80. Clutch mechanism comprises a clutch pad 130 between a surface 132 of the housing 74 and a surface 128 of the member 124 and a spring 134 urging the surfaces 128, 132 and pad 130 together, locking the tool against rotation. Axial pressure on the sleeve 122 disengages the clutch permitting rotation of the tool which is effected through the sleeve 122. Several heads 16 mounted on a carousel 14 for movement from a pick-up station 26 through orientation stations 42, 48, to a placement station 50. Orienting devices engage heads 16 at the stations 42, 48, releasing the clutch and rotating the tool (using a servo motor 202) to orient components correctly for placement at the station 50.

12 Claims, 3 Drawing Sheets

Fig_1

Fig_2

Fig_3

APPARATUS FOR HANDLING ELECTRICAL OR ELECTRONIC COMPONENTS

BACKGROUND OF THE INVENTION

This invention is concerned with apparatus for handling electrical or electronic components, for example in a component placement machine. The components may be of a variety of shapes and sizes, for example so-called flat packs, S.0. style transistors, leadless chip carriers, dual in line packages, melf-type components and the like, as well as so-called "chips".

In the manufacture of electrical or electronic apparatus it is necessary to assemble a plurality of components on a suitable substrate, for example a printed circuit board. A number of systems have been proposed for handling the components to be placed on a substrate and many of these have proposed the use of pick-up heads having a suitable tool by which a component may be picked up. The tools have been of various types, depending on the components to be handled to some extent; for example the tools may mechanically grip the components or may use suction or a magnetic system to retain a component on the tool of the pick-up head when the component is removed from a suitable component supply means for delivery elsewhere for example to a suitable placement position where the component may be placed on a substrate e.g. a printed circuit board. It is important to ensure that the components are correctly oriented when placed on a printed circuit board and one such means for orienting a component is described in our PCT Patent Application Publication No. WO 85/03404. In patent application components are retained on the pick-up head using suction, the components being centered and oriented relative to an axis of the head by means of jaws which engage the component to center it. Orientation of the component is then achieved by rotating the head about its axis. In British patent No. 2096498 is described a mechanism for mounting chip type circuit elements comprising an indexing member and a plurality of mounting heads mounted on said indexing member, each mounting head including a mounting head shaft mounted for both rotation and for axial sliding movement, a suction pin mounted on an end of the mounting head shaft and adapted to pick up and hold a circuit element, and gear means for transmitting rotational torque to the mounting head shaft. In the machine described by way of example in this British patent the gear means on a mounting head is engaged by a gear when the head is carried by an indexing member to a position at which the gear is disposed for rotating the mounting head to an appropriate position. In the mechanism described a pulse motor (otherwise known as a stepping motor) rotates the gear so that the mounting head is rotated through 15° for each operating step of the pulse motor 72. A lock mechanism is provided by which the mounting head is locked in a particular position unless it is necessary to alter the mounting direction of the circuit element. The locking mechanism includes a lock lever the front end of which engages the gear means provided on the mounting head to prevent rotation thereof. Whilst the mechanism described in this British patent may be effective to provide a coarse orientation of the circuit element it is inappropriate for a very precise orientation of a circuit element which is necessary in the most accurate machines. The system described in the British patent requires gears to be provided on each head which, to achieve satisfactory precision, must have a very fine pitch and be precisely machined—the provision of such gears is expensive. Moreover, the system of engaging the gear means on the mounting head with a static gear at an appropriate position during rotation of the indexing member requires that the static gear mesh with the gear means on the mounting head—problems are likely to arise in achieving meshing of the static gear and the gear means on the mounting head without damage to the gears. Furthermore, a system of locking the mounting head against rotation which relies upon the mechanical engagement of a locking member between the teeth of the gear means on the mounting head is also likely to lead to damage of the gear and militates against rotational accuracy better than the angle between adjacent gear teeth. In addition the use of a gear train as described may lead to considerable inertia in operation of the gear means and provides a somewhat bulky mounting head. A further disadvantage of the mechanism described in the aforementioned British patent is the use of a pulse motor to effect rotation—this places a restriction on both rotational accuracy (unless complex gear trains are used) and provides limitations on the speed of operation due to the rate at which pulse motors can be accelerated and decelerated during their operation.

One of the various objects of the present invention is to provide apparatus for handling electrical or electronic components comprising a pick-up head having improved means by which components carried by the pick-up head may be rotated to a desired orientation.

BRIEF SUMMARY OF THE INVENTION

The invention provides apparatus for handling electrical or electronic components comprising a pick-up head having a pick-up tool, a support on which the pick-up head is mounted, the support being mounted for movement, in the operation of the apparatus, to move the pick-up head between a pick-up station at which a component is picked up and a placement station at which the component is placed at a desired position, the support moving the pick-up head through one or more orientation stations intermediate the pick-up and placement stations, the apparatus comprising orienting means, mounted at at least one orientation station, arranged, in the operation of the apparatus, to engage a pick-up head at that orientation station and rotate the tool about an axis of the head to a desired orientation, the pick-up head comprising clutch means which normally retains the tool locked against rotation but which is released, to permit rotation of the tool, by relative movement of the orienting means and pick-up head into engagement with one another and which is re-engaged to prevent rotation of the tool when the orienting means and pick-up head are moved out of engagement.

Preferably the clutch means of apparatus in accordance with the invention comprises a clutch pad mounted between a surface fixed to a portion of the support, suitably a surface of a tubular support housing coaxial with the axis of the pick-up head and a surface of the tool, suitably brake means mounted on the tubular support housing for rotation about the axis, the tool also comprising an elongated support member mounted in the tubular support housing for movement lengthwise of the axis and for rotation about the axis, said brake means and the elongated support member being relatively movable lengthwise of the axis but connected together so that relative movement around the axis is militated against.

Preferably the orienting means of apparatus according to the invention comprises a drive member mounted coaxially with the axis of the pick-up head at an orientation station for movement along the axis into and out of driving engagement with the tool of the pick-up head, and for rotation about the axis; conveniently the drive member comprises a drive coupling movable by said axial movement of the drive member into an out of engagement with a coupling of the tool, the construction and arrangement being such that further axial movement of the drive member releases the clutch means and that rotation of the drive member when the clutch means is released effects rotation of the tool about the axis through the drive coupling and said coupling of the tool. Conveniently the orienting means also comprises a servo motor and rotary encoder by which rotation of an output shaft of the orienting means can be determined whereby to determine the rotation of the tool about the axis of the pick-up head.

Preferably the support of apparatus according to the invention comprises a carousel mounted for rotation about an axis parallel with the axes of the pick-up heads mounted thereon at equally spaced intervals about the axis of the carousel, the carousel being mounted for stepwise indexing movement about its axis to move the pick-up heads through the stations. Conveniently the pick-up heads are so mounted on the carousel that as the carousel rotates about its axis the heads are also moved in a direction parallel with the axis of rotation during part, at least, of a complete revolution of the carousel.

Preferably the pick-up tool of apparatus according to the invention comprises a suction nozzle by which the components are picked up and retained in engagement with the tool. However the pick-up tool may comprise other means known for picking up components in electrical or electronic component placement apparatus.

Preferably apparatus according to the invention comprises an inspection station disposed upstream of an orientation station, the inspection station comprising a camera arranged to inspect a component carried by a pick-up head at the inspection station, the apparatus comprising means for controlling the operation of the apparatus according to an image received from the camera, said means for controlling being arranged to control operation of the orienting means when said component has been moved to said orientation station whereby to orient said component to a desired orientation.

There now follows a detailed description, to be read with reference to the accompanying drawings, of an electronic component placement machine comprising apparatus for handling the electronic components embodying the invention. It will be realised that this component placement machine has been selected for description to illustrate the invention by way of example.

DETAILED DESCRIPTION OF THE PREFERRED EMBODIMENT OF THE INVENTION

Figure 1:
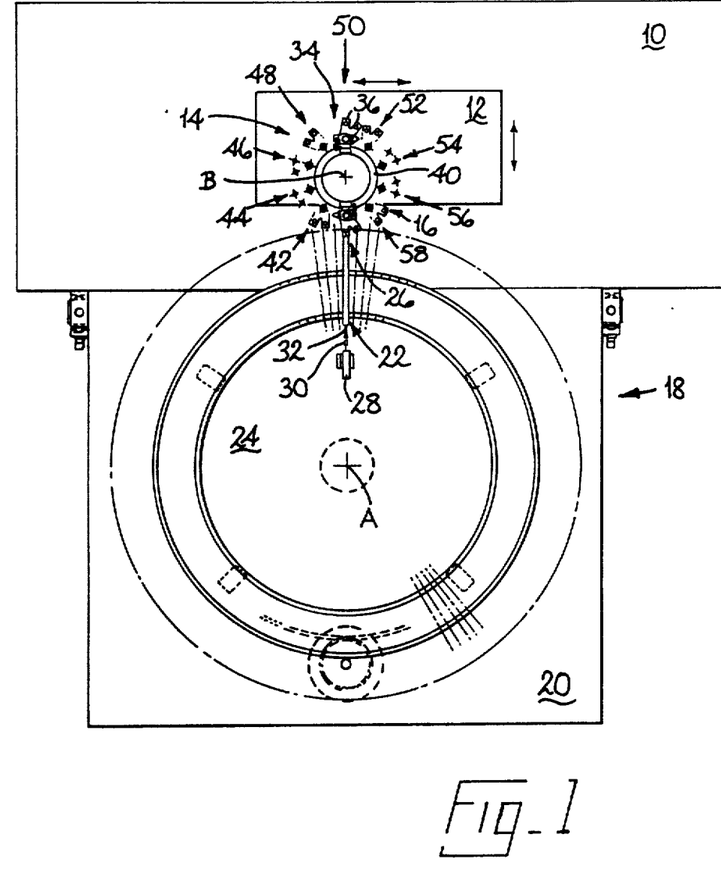
FIG. 1 is a diagrammatic plan view of a component placement machine embodying the invention.

A component placement machine embodying the invention is shown in FIG. 1. The machine comprises a frame 10 on which is mounted an X-Y table 12 and apparatus for handling electrical components comprising a plurality of pick-up heads 16 and a support comprising a carousel 14 on which the pick-up heads 16 are mounted. Substrates (not shown) on which components are to be placed may be mounted in known manner in accurately known positions on the X-Y table; means (not shown) may be provided for feeding substrates to and from the X-Y table 12 for example as described in United Kingdom patent No. 2150098. The X-Y table may be mounted and driven by any suitable means, a number of which are known: preferably the X-Y table 12 is mounted and driven by means substantially similar to those described in PCT patent application No. WO 85/03404.

The component placement machine further comprises component supply means 18 comprising a sub frame 20, secured in known location to the main frame 10, on which are mounted a plurality of component supply magazines 22. The component supply means 18 comprises a turntable 24 mounted for rotation about a vertical axis A on the sub frame 20, the component supply magazines 22 being mounted radially (about the axis A) on the turntable. In the operation of the illustrative component placement machine, the turntable is rotated about the axis A by drive means to move an appropriate one of the component supply magazines 22 to a transfer station of the supply means 18, viz a pick-up station 26. The component supply magazines 22 shown in FIG. 1 are so-called tape feeders but other forms of magazine may be used if desired, for example so-called "stick" feeders, vibratory feeders, or stack feeders of the type described in detail in our United Kingdom patent No. 2147888. As is well known, the components in a tape feeder are packaged in pockets disposed at equally spaced intervals along a flexible tape which is wound about a suitably dimensioned reel; the components are preferably positioned in the pockets of the tape in an orientation which is known however, neither the positioning nor the orientation of the components in the pockets needs to be particularly precise. In order to deliver a component using a tape feeder to a pick-up position, the tape is indexed to move the tape through a feed step identical with the spacing between the center of one pocket and the center of the next adjacent pocket. The component supply means 18 of the illustrative component placement machine comprises a cylinder 28 mounted on the sub-frame 20 in register with a component supply magazine 22 at the pick-up station 26. The cylinder 28 is so positioned that, on admission of fluid under pressure to the cylinder 28 behind a piston slidable in the cylinder, in the operation of the machine, a piston rod 30 is extended from the cylinder into engagement with an indexing plunger 32 of the magazine, whereby to index the tape, carrying components, through a feed step to present a component at the pick-up position of the pick-up station 26.

As mentioned above, the carousel 14 carries a plurality of pick-up heads 16. The pick-up heads 16 are mounted on carriers 34, each carrier 34 comprising a bifurcated member 35 having two arms 36, at an outer end portion of each of which a pick-up head is clamped.

Each carrier 34 is mounted on a vertical rod 38 for sliding movement lengthwise of the rod; the bifurcated member 35 is also mounted for rotary movement about a vertical axis C of the rod 38. Each rod 38 is secured to a spider member 40 of the carousel 14 at an end portion of one of ten arms of the spider member 40. Thus the carousel 14 of the illustrative machine comprises ten carriers 34 and twenty pick-up heads 16.

Each carrier 34 also comprises a bracket 60 on which is mounted a slideway 62 having opposite outer edge surfaces parallel to one another and extending generally vertically parallel to the axis C of the associated rod 38. Guide rollers 64 are arranged to run on the opposed parallel guide surfaces of the slideway 62, the guide rollers 64 being rotatably mounted on clamp means 66 secured to the spider member 40. The clamp means 66 also clamps the rod 38 to the spider member 40. By appropriate adjustment of the various parts of the clamp means 66 the position of each carrier 34 relative to adjacent carriers 34 can be adjusted during the initial setting up of the illustrative machine to accurately locate operative positions of the carriers 34 as discussed below.

As hereinbefore mentioned each carrier 34 comprises a bifurcated member 35 comprising two arms 36. Each of the bifurcated members 35 is carried for vertical movement along the rod 38 by its associated bracket 60 and is mounted for pivotal movement about the axis C of the associated one of the rods 38 to move the pick-up heads 16 at the ends of the arms 36 between an operative position and inoperative positions. A pneumatically operated piston and cylinder arrangement (not shown) is mounted on each of the brackets 60 with the cylinder axis extending generally vertically, to operate a flexible linkage, viz. a bowden cable mechanism 68 to pivot the bifurcated member 35 about the axis C and move one or other of the two pick-up heads 16 associated with that particular carrier 34 into the operative position associated with that carrier, the other of the pick-up heads, of course, being simultaneously moved to its inoperative position. Whereas the preferred flexible linkage is a bowden cable mechanism other types of flexible linkage may be used if appropriate; e.g. suitable chain or belt linkages. However the bowden cable mechanism is preferred because of its simplicity, compactness and ability to be readily flexed to a suitable position. The operative positions associated with each of the carriers 34 are equiangularly spaced about a vertical axis B about which the carousel 14 is rotatable, the operative positions of the pick-up heads 16 being determined by the position of pick-up surfaces of the heads when placing a component on a substrate at a placement station 50 which should each occupy precisely the same location.

The carousel 14 is mounted for rotation on a column (not shown) fixed to the main frame 10. An appropriately configured cam track is formed around the column. A cam provided by a cam roller (not shown) is mounted on the bracket 60 of each of the carriers 34, the cam rollers being received in the cam track of the column. The cam rollers are urged against a lowermost surface of the cam track and are adjusted so that horizontal datum surfaces of each carrier 34 lie in the same horizontal place when that carrier is at the placement station 50. Thus, as the carousel 14 rotates about its axis B on the column the cam rollers slide in the cam track and cause movement of the brackets 60 (and thus the heads 16 mounted on those brackets 60) in a direction parallel with the axis B during part, at least, of a complete revolution of the carousel 14.

Means (not shown) comprising motor means and a computer control system of the illustrative machine are provided for intermittently rotating the spider member 40 about the vertical axis B of the carousel 14 upon a signal from the computer control system. Preferably the motor means comprises a servo motor and rotary encoder controlled by the control system to rotate the spider member 40 through a suitable gear system (not shown). Each intermittent rotary motion of the spider member 40 advances an arm of the spider member through an angle of 36°. Thus the carousel 14 is mounted for indexing movement around the axis B to index the pick-up heads 16 at operative positions disposed at equally spaced intervals about the axis of rotation B of the carousel 14 in a stepwise movement through a plurality of stations of the illustrative machine. The stations comprise the pick-up station 26, a coarse orientation station 42, a mechanical orientation station 44, an inspection station 46, a fine orientation station 48, the placement station 50, a spare station 52, a dump station 54, a head select station 56 and a pre-orientation station 58; further details of the various stations will be given in the following description.

Each of the pick-up heads 16 is substantially identical in construction and operation, the only significant difference being the dimensions and configuration of pick-up surfaces of tools of each pick-up head 16. For convenience, therefore, only one pick-up head 16 will be described in detail hereinafter: this pick-up head is shown in detail in FIG. 2 of the accompanying drawings.

Figure 2:
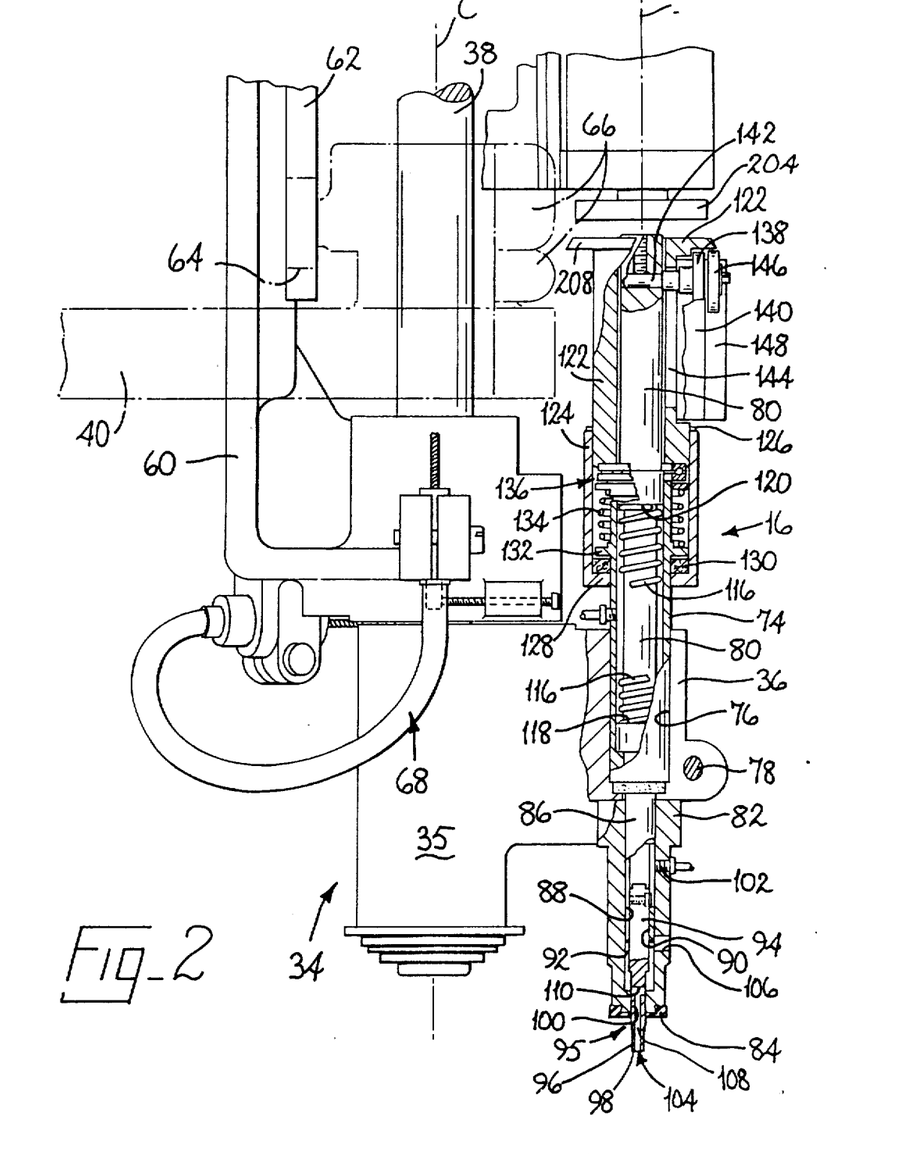
FIG. 2 is a side view, partly in section and with parts broken away, showing a pick-up head of the illustrative machine.

As hereinbefore mentioned each pick-up head 16 is mounted at an end portion of one of the arms 36. A tubular support housing 74 of the head 16 is received in a cylindrical bore 76 in the arm 36 and clamped in place by a bolt 78 with an axis D of the pick-up head 16 substantially vertical. The head also comprises a tool having an elongated support member 80 mounted in bearings carried by the housing 74 for movement in a direction lengthwise of the axis D and for rotational movement about the axis D. A tool body 82 is secured to a lower end portion of the support member 80 below the arm 36; the tool body 82 terminates at a lower end portion in a first pick-up surface 84 of an appropriate dimension and configuration. A lower end portion 86 of the support member 80 is housed in a cylindrical bore 88 of the tool body 82, the lower end portion 86 forming a substantially airtight seal with the cylindrical bore 88 and the tool body 82 being secured to the lower end portion 86 by suitable clamping means (not shown). A cylinder 90 is formed in the lower end portion 86 of the support member 80 within the body 82, the cylinder being coaxial with the axis D and opening downwardly into a chamber 92 formed by a lower portion of the cylindrical bore 88. A piston member 94 is mounted for sliding movement in the cylinder 92 and at a lower end portion provides a pick-up end portion 95 terminating with a tip 96 having a second pick-up surface 98 of the tool at the lowermost end portion thereof. The second pick-up surface 98 is of smaller cross-sectional area than the first pick-up surface 84. The pick-up end portion 95 of the piston member 94 is slidable in a passage 100 in the tool body 82 between an operative position in which the tip 96 projects through an opening (provided by the end of the passage 100) in the first pick-up surface 84 beyond the first pick-up surface 84 (in which position the piston member is shown in FIG. 2) and an inoperative position in which the tip 96 is retracted into the tool body 82 inwardly of the first pick-up surface 84. A first port 102 is provided in the tool body 82; air can be admitted through the first port 102 to the cylinder 90 above the piston member 94 to drive the piston member 94 downwardly to its operative position. The first port 102 can likewise be connected to vacuum to retract the piston member 94 to its inoperative position.

A second port 106 is provided in the tool body opening to the chamber 92. Application of vacuum to the port 106 allows application of suction through the chamber 92, passages 108,110 in the piston member 94 through an opening 104 to the second pick-up surface 98. Thus, when the piston 94 is in its operative position such suction applied through the opening 104 to the second pick-up surface 98 is effective to retain a component engaged by the surface 98 in contact therewith. When the piston member 94 is in its inoperative position, application of vacuum to the second port 106 is effective to apply suction to the first pick-up surface 84 through the chamber 92 and the passage 100, around the tip 96 of the piston member 94, as well as through the passages 108, 110 in the piston member 94. Suction applied to one of the pick-up surfaces 84,98 is sufficient to ensure that a component is held firmly against that surface so that if the tool is rotated about the axis D, the component is likewise rotated.

In a machine in accordance with the invention generally similar to the illustrative machine, other forms of pick-up tool having other pick-up means may be provided, for example a mechanical system using gripping fingers or a magnetic system (for magnetic components) or other forms of suction tool, provided that once a component is engaged by the pick-up means of the tool, the component is retained in engagement with the pick-up surface so that if the tool is rotated about its axis D the component is likewise rotated.

As hereinbefore mentioned the support member 80 is mounted in a tubular support housing 74 for sliding movement lengthwise of the axis D of the pick-up head 16 relative to the housing 74. A spring 116 acting between a stop face 118 in the housing and a collar 120 on the support member 80 urges the support member 80 to a raised position determined by engagement of the tool body 82 with a stop face of the arm 36 in which the pick-up head 16 is mounted. When the carousel 14 is being rotated about its axis B the pick-up heads 16 occupy this raised position in which they are clear of other operating instrumentalities of the illustrative machine.

As well as being movable lengthwise of the axis D of the pick-up head 16 the support member 80 and the tool body 82 are mounted for rotation around the axis D as described below. An upper end portion of the elongated support member 80 projects upwardly beyond an uppermost part of the tubular support housing 74. The tool of the illustrative machine further comprises coupling means including a drive sleeve 122 slidingly received on this upper end portion of the support member 80 and a tubular member 124; a lower end portion of the drive sleeve 122 is received in a cylindrical upper end portion of the tubular member 124 to which the drive sleeve 122 is secured. An outwardly projecting collar 126 of the drive sleeve 122 engages an upper edge of the tubular member 124. The tubular member 124 comprises, at a lower end portion, an inwardly projecting flange 128. A clutch pad 130 is supported on an upwardly facing surface of the flange 128 and is urged towards a downwardly facing surface of a collar 132 of the support housing 74 by a spring 134. Clutch means of the illustrative machine thus comprises the flange 128, the clutch pad 130, the collar 132 and the spring 134. The clutch pad 130 comprises slightly raised, radial, portions on opposite sides thereof the raised portions at opposite sides of the pad being disposed along orthogonal radii, thus to provide accommodation for any slight misalignment of the parts of the tool and to ensure adequate engagement of the pad and surfaces. The spring 134 acts between an upwardly facing surface of the collar 132 and a lower member of a bearing race 136 slidingly received on an outer upper end portion of the housing 74 and with an upper member of the race 136 housed in a recess in a lower face of the drive sleeve 122. Thus, in a normal condition of the pick-up head 16, the spring 134 bearing on the race 136 urges the drive sleeve 122 upwardly, relative to the housing 74, the drive sleeve 122 secured to the tubular member 124 thus urging the tubular member 124 upwardly and, through the flange 128, urging the clutch pad 130 firmly against the collar 132 of the support housing 74. Thus, in the normal condition of the pick-up head, the tubular member 124 is locked through the clutch pad 130 to the collar 132 of the housing so that the tool cannot rotate relative to the housing and thus is unable to rotate about the axis D. However, by a downward pressure, viz. along the axis D, on the drive sleeve 122, the clutch pad 130 may be released from the collar 132 thereby permitting rotation of the tool about the axis D. In order to effect such rotation, therefore, where it is necessary in the operation of the illustrative machine, orienting means 192 is provided to engage the drive sleeve 122 and urge it downwardly to release the clutch pad 130 (permitting rotation of the drive sleeve 122 about the axis D) and to effect rotation of the drive sleeve 122 through a desired angle under the control of the computer control system. Rotation of the drive sleeve 122 is effective to rotate the support member 80 (and thus the tool body 82 secured thereto) about the axis D of the pick-up head 16 as described below.

Figure 3:
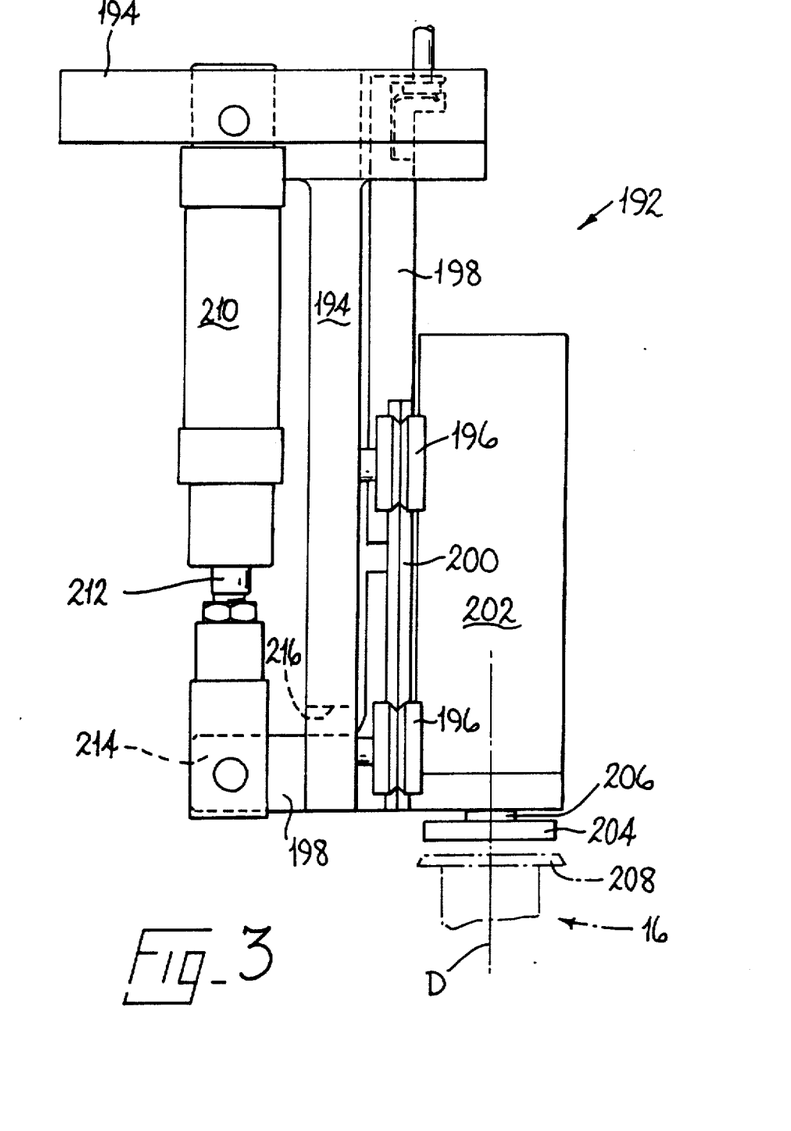
FIG. 3 is a side view showing orienting means of the machine.

Orienting means 192 is mounted at each appropriate station of the illustrative machine, namely the coarse orientation station 42, the fine orientation station 48, and the pre-orientation station 58. Each orienting means is substantially similar in general construction and arrangement except as described below. For convenience, therefore, only one of the orienting means is described hereinafter. The orienting means 192 shown in FIG. 3 is a construction used at the stations 42, 58. This orienting means comprises a mounting bracket 194 mounted on the column fixed to the main frame 10. Four guide rollers 196 (only two visible in FIG. 3) are mounted for rotation on the mounting bracket 194. A support bracket 198 comprises a slide 200 secured thereto, the slide being mounted between the guide rollers 196, the rollers being adjusted to guide the slide substantially vertically. Also mounted on the bracket 198 is a servo motor 202 including a rotary encoder. A disc drive coupling 204 is secured to the output shaft 206 of the servo motor 202. The output shaft 206 of the motor 202 is mounted for rotation about a vertical axis which is coaxial with the axis D of a pick-up head 16 at the orientation station at which the orienting means 192 is mounted. The disc coupling 204 is disposed in register with a disc coupling 208 provided on an upper end portion of the drive sleeve 122 of the tool of the pick-up head 16 disposed at the orientation station. An air cylinder 210 is mounted on the bracket 194 with a piston rod 212 projecting downwardly therefrom, the cylinder 210 and piston rod 212 extending generally vertically. A lower end portion of the piston rod 212 is secured to an arm 214 of the support bracket 198 extending through an opening 216 in the mounting bracket 194. The support bracket 194 is urged upwardly to a raised position in which it is shown by a spring (hot shown). When the support bracket 198 is in its raised position the disc couplings 204, 208 are out of engagement. The disc couplings 204, 208 are moved into engagement by admission of air under pressure to the cylinder 210 above a piston thereof to extend the piston rod 212 downwardly out of the cylinder 210. The couplings 204,208 have a frictional covering on their engaging surface so that when one is rotated, the engaging coupling is also rotated, without slipping. Downward motion of the support bracket 198 under the influence of the cylinder 210 is arranged to be sufficient to urge the drive sleeve 122 and the tubular member 124 downwardly sufficiently to release the clutch pad 130 from locking engagement with the flange 128 and the collar 132. Operation of the cylinder 210 is under the control of the computer control system of the illustrative machine: when the system determines that the clutch means is disengaged, a signal is given to the servo motor 202 causing it to rotate its output shaft 206 and thus the disc coupling 204, through a desired angle as indicated by the rotary encoder of the motor 202. Rotation of the disc coupling 204 which is at this time in engagement with the disc coupling 208 of the sleeve 122 of the tool is thus effective to rotate the drive sleeve 122. When the drive sleeve has been rotated through the desired angle, the computer control system signals the cylinder 210 to release pressure above the piston allowing the support bracket 198 to be raised by the spring (not shown) thereby raising the disc coupling 204 so that the flange 128 and collar 132 are re-engaged with the clutch pad 130 under the influence of the spring 134 thereby locking the tool against further rotation. As the bracket 198 reaches its raised position the disc couplings 204, 208 are moved out of engagement with one another thereby allowing the carousel 14 to index the pick-up head 16 from the orientation station.

The distance, parallel to the axis D, through which the support bracket 198 and disk coupling 204 must be moved in order to engage the disc coupling 208 of the tool and affect rotation of the tool is arranged to be kept to a minimum in the operation of the illustrative machine to keep the cycle times as short as possible. At the orientation stations 42, 58 only a very small movement parallel with the axis D is necessary. However, at the fine orientation station 48 because of the vertical movement of the pick-up heads 16 which takes place in this vicinity as the carousel 14 rotates about its axis B, under the influence of the cam and cam track, the clearance between the disc coupling 204 of the orienting means at the fine orientation station 48 and the disc coupling 208 of a pick-up head at this station must be considerably greater. The orienting means at this station is not shown. However, in order to reduce the inertia of the parts to be moved vertically, the servo motor is mounted on the mounting bracket 194. The disc coupling 204 is mounted on a lower end portion of a drive shaft mounted for vertical sliding movement in bearings which also permit rotation of the shaft about its axis, the shaft being coaxial with the axis D of a pick-up head 16 at the fine orientation station 48. A toothed drive pulley is keyed to the shaft for rotation therewith, the shaft being slidable in the drive pulley. A toothed drive belt passes round the drive pulley and the toothed driving wheel on the output shaft of the servo motor mounted on the mounting bracket 194. Thus the drive shaft may be moved vertically by the air cylinder to move the disc coupling into and out of engagement with the disc coupling 208 of a pick-up head at the fine orientation station 48 whilst the rotary motion is imparted to the drive shaft when necessary by the fixed servo motor. The inertia of the part of the orienting means at the fine orientation station which has to be moved vertically is thus much reduced and the vertical motion into and out of driving engagement with the disc coupling 208 can therefore be effected in about the same period of time as the much shorter motion at the orientation stations 42, 58 using the orienting means shown, albeit with a somewhat more complex rotary drive system.

As mentioned above, the pick-up means of the tools of the pick-up heads 16 is arranged to rotate with the tool itself. In the illustrative machine, the pick-up surfaces 84, 98 rotate with the tool through the angle by which they are driven by the servo motor 202. Thus a component held on the pick-up surfaces 84, 98 is likewise rotated through the same angle. This enables the angular orientation about the axis D of both the first pick-up surface 84 and the second pick-up surface 98 to be controlled by the control system of the illustrative machine. This is especially useful when handling components, for example melf components, which require tools having a pick-up surface of a special configuration adapted to accommodate the component in question. By rotating the tool about the axis D the appropriate first or second pick-up surface 84, 98 can be oriented at the pre-orientation station to register with the orientation of a component presented by the supply means 18 at the pick-up station 26. Thereafter the tool can be rotated about the axis D again, if necessary, to orient a component carried on one of the surfaces 84, 98 substantially in accordance with the orientation required at the placement station 50 of the illustrative machine. If a component when picked up needs to be rotated through a substantial angle from the orientation in which it is picked up, a coarse orientation is effected at the coarse orientation station 42, the tool of the pick-up head 16 being rotated at the station 42 through the desired angle. Irrespective of whether or not any rotation is effected at the station 42, the component may be given a further slight reorientation at the fine orientation station 48.

The illustrative machine comprises a camera (not shown) arranged at the inspection station 46 to inspect a component carried by a pick-up head 16 at the inspection station 46; the operation of the illustrative machine is controlled by the control system according to an image of the component received from the camera. The control system operates to direct a preselected placement position for a component at the placement station 50 by correction of the movement of the X-Y table 12 in accordance with the image of that component received from the camera when that component was at the inspection station 46. Likewise the control system of the illustrative machine is arranged to cause rotation (as described above) of a tool of a head 16 at the fine orientation station 48 about the axis D whereby to adjust the orientation of a component carried by the tool on one of the pick-up surfaces 84, 98 according to an image of that component received from the camera when the component was at the inspection station 46. In this way preselected placement position and orientation of a component programmed into the control system of the illustrative machine can be corrected in accordance with the precise position occupied by a component on a pick-up head 16.

At various stations of the illustrative machine, in particular the pick-up station 26, the mechanical orientation station 44, and the placement station 50, it is necessary for the tool of a pick-up head 16 to be moved along the axis D. Means is disposed at each of the appropriate stations to effect movement of the tools along the axis D at the appropriate station. As previously mentioned, the support member 80 is slidable lengthwise of the axis D relative to the drive sleeve 122. However, the support member 80 is engaged with the drive sleeve 122 for rotation about the axis D with the drive sleeve 122 as a unit: this engagement is effected by means of a roller 138 and guide member 140. The roller 138 is mounted for rotation on an axle 142 secured in an upper end portion of the support member 80, the axle 142 projecting through a slot 144 in the wall of the drive sleeve 122. The roller 138 is arranged to run on a vertical face of the guide member 140, the guide member 140 being secured to the drive sleeve 122; the vertical face of the guide member 140 is parallel with the axis D of the pick-up head 16. A second roller 146 is also mounted on the axle 142, outwardly of the roller 138, and engages a leaf spring 148 secured to the drive sleeve 122 and bearing on the roller 146 to urge the roller 138 firmly against the vertical face of the guide member 140. By adjustment of the position of the drive member 140 on the sleeve 122 during the initial setting up of the pick-up head 16 the angular orientation about the axis D of the support member 80 (and thus the tool body 82 secured thereto) relative to the drive sleeve 122 can be adjusted as desired. Thus, when the support member 80 is moved lengthwise of the axis D relative to the drive sleeve 122 engagement of the roller 138 with the vertical face of the guide member 140 assists in guiding the support member 80 along a path parallel with the axis D. During movement of the support member 80 and attached tool body 82 from the raised position in which the tool of the pick-up head is shown in FIG. 2 to a lower position and return movement to the raised position, rotation of the drive sleeve 122 is prevented by engagement of the clutch pad 130 between the flange 128 and collar 132 under pressure applied by the spring 134, thereby preventing rotation of the support member 80 about the axis D by means including the rollers 138, 146, guide member 140 and spring 148 discussed above. At the mechanical orientation station 44 a mechanical location jaw system may be disposed if desired.

Although to operate the various parts of the illustrative machine servo motors and rotary encoders are used, other controllable drive means may be used e.g. stepping motors. However, servo motors are preferred in view of their speed of operation, precision and general convenience.

In the operation of the illustrative machine, using the orienting means described herein, it is possible to conveniently and rapidly orient the pick-up means of a tool of a pick-up head to a desired orientation both before a component is picked up so that a specially configured pick-up surface of the tool is correctly oriented in register with the component prior to pick-up, and after picking up a component to orient the component correctly relative to a placement position on a substrate on which the component is to be placed.

The illustrative machine is able to handle picking and placing of electrical or electronic components at high rates and to orient the component accurately to a relatively fine angular position, to within an accuracy of $\pm 3°$ in the case of smaller components and an accuracy of $\pm 1°$ in the case of larger components.

The construction and arrangement of the illustrative machine is such that the cycle time is rapid and delays due to inertia of moving parts are militated against. Because the tools are locked against rotation by the clutch means, during movement of the carousel and the general operation of the illustrative machine except when tools are being oriented at the orientation stations 42, 48, 58 there is no significant possibility of the tools becoming misoriented during operation of the illustrative machine for example by vibration or by accidental contact, as could easily occur in the construction described in UK patent No. 2096498B. Furthermore, the orienting means and the construction of the pick-up heads is relatively simple and does not require the cutting of expensive gears nor the control necessary to ensure engagement of gearing when it is necessary to orient a tool, as is the case of the machine described in UK patent No. 2096498B.

In the operation of the illustrative machine, if a particular pick-up head should fail to pick-up a component or a component, having been picked-up, be discovered to be faulty when inspected at the inspection station 46, the control system will cause a subsequent pick-up head to pick-up the appropriate component and reschedule the machine operation as necessary. When a substandard or incorrect component is detected at the inspection station 46, this will be carried through the placement station 50 without operation of the placement mechanism and dumped into a reject container at the dump station 54.

I claim:

1. Apparatus for handling electrical or electronic components comprising a pick-up head having a pick-up tool, a support on which the pick-up head is mounted, the support being mounted for movement, in the operation of the apparatus, to move said pick-up head between a pick-up station at which a component is picked up and a placement station at which the component is placed at a desired position, means for displacing the support to move said pick-up head through one or more orientation stations intermediate the pick-up and placement stations, orienting means, mounted at at least one orientation station, arranged to engage a pick-up head at that orientation station and rotate the tool about an axis of the head to a desired orientation, said pick-up head including clutch means which normally retains the tool locked against rotation but which is released, to permit rotation of the tool, by relative axial movement of the orienting means and pick-up head into engagement with one another and which is re-engaged to prevent rotation of the tool when the orienting means and pick-up head are moved out of engagement, and said orienting means at each orientation station including a drive member mounted coaxially with the axis of a pick-up head at that station for movement along the axis into and out of axial driving engagement with the tool of the pick-up head to displace said pick-up head between selected upper and lower positions and for rotation of the tool about the axis to change the orientation of the tool.

2. Apparatus according to claim 1 wherein the clutch means comprises a clutch pad mounted between a surface fixed to a portion of the support and a surface of the tool and means urging the surfaces and the clutch pad into engagement to lock the tool against rotation.

3. Apparatus according to claim 2 wherein the pick-up head comprises a tubular support housing coaxial with the axis of the pick-up head secured to the support on which the pick-up head is mounted and providing said surface fixed to the support, and wherein the tool comprises an elongated support member mounted in the tubular housing for movement lengthwise of the axis and for rotation about the axis and coupling means providing said surface of the tool, mounted for rotation about the axis, said coupling means and the elongated support member being relatively movable lengthwise of the axis but connected together so that relative movement around the axis is militated against.

4. Apparatus according to claim 1 wherein the drive member comprises a drive coupling movable by axial movement of the drive member into engagement with a coupling of the tool, the construction and arrangement being such that further axial movement of the drive member releases the clutch means and that rotation of the drive member when the clutch means is released effects rotation of the tool about the axis through the drive coupling and said coupling of the tool.

5. Apparatus according to claim 1 wherein the orienting means comprises a servo motor and rotary encoder by which rotation of an output shaft of the orienting means can be determined whereby to determine the rotation of the tool about the axis of the pick-up head.

6. Apparatus for handling electrical or electronic components comprising
   a pick-up head having a pick-up tool,
   a support on which the pick-up head is mounted, the support being mounted for movement, in the operation of the apparatus, to move said pick-up head between a pick-up station at which a component is picked up and a placement station at which the component is placed at a desired position,
   means for displacing the support to move said pick-up head through one or more orientation stations intermediate the pick-up and placement stations,
   orienting means, mounted at at least one orientation station, arranged to engage and axially displace a pick-up head at that orientation station and to rotate the tool about an axis of the head to a desired orientation,
   said pick-up head including clutch means which normally retains the tool locked against rotation but which is released, to permit rotation of the tool, by relative axial movement of the orienting means and pick-up head into engagement with one another and which is re-engaged to prevent rotation of the tool when the orienting means and pick-up head are moved out of engagement, and
   said support including a carousel mounted for rotation about an axis parallel with the axes of pick-up heads mounted thereon at equally spaced intervals about the axis of the carousel, said carousel being mounted for stepwise movement about the axis to move the pick-up heads through the stations.

7. Apparatus according to claim 6 wherein the pick-up heads are so mounted on the carousel that as the carousel rotates about its axis the heads are also moved in a direction parallel with the axis of rotation of the carousel during part, at least, of a complete revolution of the carousel.

8. Apparatus according to claim 7 wherein said movement parallel to the axis of rotation is achieved by means comprising a cam and an appropriately configured cam track in which the cam runs as the carousel rotates to effect said movement parallel to the axis of rotation.

9. Apparatus according to claim 1 wherein the pick-up tool comprises suction pick-up means.

10. Apparatus for handling electrical or electronic components comprising
   a pick-up head having a pick-up tool,
   a support on which the pick-up head is mounted, the support being mounted for movement, in the operation of the apparatus, to move said pick-up head between a pick-up station at which a component is picked up and a placement station at which the component is placed at a desired position,
   means for displacing the support to move said pick-up head through one or more orientation stations intermediate the pick-up and placement stations,
   orienting means, mounted at at least one orientation station, arranged to engage and axially displace a pick-up head at that orientation station and to rotate the tool about an axis of the head to a desired orientation,
   said pick-up head including clutch means which normally retains the tool locked against rotation but which is released, to permit rotation of the tool, by relative movement of the orienting means and pick-up head into engagement with one another and which is re-engaged to prevent rotation of the tool when the orienting means and pick-up head are moved out of engagement, and
   wherein said pick-up tool comprises suction pick-up means including
   a body having a first pick-up surface at one end portion thereof,
   a cylinder within the body and
   a piston member mounted for sliding movement in the cylinder and having a pick-up end portion terminating with a tip having a second pick-up surface of smaller area than the first pick-up surface, the piston member being slidable between an operative position in which its tip projects through an opening in the first pick-up surface beyond the first pick-up surface and an inoperative position in which the tip is retracted inwardly of the first pick-up surface,
   said body having a first port through which air can be admitted to said cylinder to drive said piston member to its operative position and which can be connected to vacuum to retract said piston member to its inoperative position,
   means by which, when the piston member is in its inoperative position, suction may be applied to said first pick-up surface whereby a component engaged by said first pick-up surface is retained in contact with the surface when the suction is applied and by which, when said piston member is in its operative position, suction may be applied through an opening in said piston member to said second pick-up surface whereby a component engaged by said second pick-up surface is retained in contact with said second pick-up surface when suction is applied through the opening in said piston member.

11. Apparatus for handling electrical or electronic components comprising
a pick-up head having a pick-up tool,
a support on which the pick-up head is mounted, the support being mounted for movement, in the operation of the apparatus, to move said pick-up head between a pick-up station at which a component is picked up and a placement station at which the component is placed at a desired position,
means for displacing the support to move said pick-up head through one or more orientation stations intermediate the pick-up and placement stations,
orienting means, mounted at at least one orientation station, arranged to engage and axially displace a pick-up head at that orientation station and to rotate the tool about an axis of the head to a desired orientation while said pick-up head is being axially displaced,
said pick-up head including clutch means which normally retains the tool locked against rotation but which is released, to permit rotation of the tool, by relative movement of the orienting means and pick-up head into engagement with one another and which is re-engaged to prevent rotation of the tool when the orienting means and pick-up head are moved out of engagement, and
said support including a plurality of carriers on each of which a plurality of pick-up heads is mounted, each carrier being movable to move the heads into and out of an operative position.

12. Apparatus according to claim 1 comprising an inspection station disposed upstream of an orientation station, the inspection station comprising a camera arranged to inspect a component carried by a pick-up head at the inspection station, the apparatus comprising means for controlling the operation of the apparatus according to an image received from the camera, said means for controlling being arranged to control operation of the orienting means when said component has been moved to said orientation station whereby to orient said component to a desired orientation.

* * * * *